(12) United States Patent
Sung et al.

(10) Patent No.: US 9,379,017 B1
(45) Date of Patent: Jun. 28, 2016

(54) METHOD OF FORMING A SEMICONDUCTOR STRUCTURE INCLUDING A PLURALITY OF FINS AND AN ALIGNMENT/OVERLAY MARK

(71) Applicant: GLOBALFOUNDRIES Inc., Grand Cayman (KY)

(72) Inventors: Min Gyu Sung, Latham, NY (US); Chanro Park, Clifton Park, NY (US); Hoon Kim, Clifton Park, NY (US); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/687,203

(22) Filed: Apr. 15, 2015

Related U.S. Application Data

(60) Provisional application No. 62/102,282, filed on Jan. 12, 2015.

(51) Int. Cl.
*H01L 21/308* (2006.01)
*H01L 21/8234* (2006.01)
*H01L 21/311* (2006.01)
*H01L 21/306* (2006.01)
*H01L 21/02* (2006.01)
*H01L 21/027* (2006.01)

(52) U.S. Cl.
CPC .... *H01L 21/823412* (2013.01); *H01L 21/0217* (2013.01); *H01L 21/0276* (2013.01); *H01L 21/02164* (2013.01); *H01L 21/02532* (2013.01); *H01L 21/02592* (2013.01); *H01L 21/3081* (2013.01); *H01L 21/30604* (2013.01); *H01L 21/31116* (2013.01); *H01L 21/31144* (2013.01); *H01L 21/823431* (2013.01)

(58) Field of Classification Search
CPC ..... H01L 27/088; H01L 21/308; H01L 29/66; H01L 21/762; H01L 27/108; H01L 21/033; H01L 21/0334; H01L 21/3083; H01L 21/3081; H01L 27/0886
See application file for complete search history.

(56) References Cited

U.S. PATENT DOCUMENTS 9,123,659 B1 * 9/2015 Fu et al. ............... H01L 21/3086

* cited by examiner

*Primary Examiner* — Selim Ahmed
(74) *Attorney, Agent, or Firm* — Amerson Law Firm, PLLC

(57) ABSTRACT

A method includes providing a semiconductor structure including a substrate that includes a material to be patterned. First and second mandrels are formed over the substrate using a common photolithography process that defines a position of the first mandrel relative to the substrate and a position of the second mandrel relative to the substrate. A first sidewall spacer is formed adjacent the first mandrel and a second sidewall spacer is formed adjacent the second mandrel. After the formation of the first and the second sidewall spacers, the first mandrel is removed. The second mandrel remains in the semiconductor structure. A first mask element is provided on the basis of the first sidewall spacer. A second mask element is provided on the basis of the second mandrel and the second sidewall spacer. The material to be patterned is patterned on the basis of the first and the second mask elements.

18 Claims, 12 Drawing Sheets

METHOD OF FORMING A SEMICONDUCTOR STRUCTURE INCLUDING A PLURALITY OF FINS AND AN ALIGNMENT/OVERLAY MARK

BACKGROUND OF THE INVENTION

1. Field of the Invention

Generally, the present disclosure relates to methods for the manufacturing of integrated circuits, and, in particular, to methods for the manufacturing of integrated circuits wherein sidewall image transfer techniques are employed.

2. Description of the Related Art

Integrated circuits include a large number of circuit elements which include, in particular, field effect transistors. In a field effect transistor, a gate electrode is provided that may be separated from a channel region by a gate insulation layer providing an electrical insulation between the gate electrode and the channel region. Adjacent the channel region, a source region and a drain region are formed, which are doped differently than the channel region. In addition to planar transistors, transistors that can be used in integrated circuits include transistors wherein the channel region is formed in one or more elongated semiconductor regions, which are denoted as fins. Types of transistors wherein the channel region is formed in one or more fins include FinFET transistors and Tri-Gate transistors.

For improving the performance of FinFET transistors and Tri-Gate transistors, it may be desirable to reduce the dimensions of the fins in the transistors. However, the possibility of forming small features by means of conventional techniques of photolithography and etching may be limited by the resolution of the photolithography process. The resolution of a photolithography process may depend on the wavelength of light that is used in the photolithography process for projecting a photomask to a photoresist, and the numerical aperture of the lens that is used for projecting the photomask to the photoresist.

For providing small features such as fins of FinFET transistors and/or Tri-Gate transistors that have dimensions which are smaller than the resolution limits of conventional photolithography processes, multiple patterning techniques have been developed, which include sidewall image transfer (SIT) techniques.

In sidewall image transfer techniques, sacrificial features which are denoted as "mandrels" are formed from a mandrel layer which is provided over an etch stop layer. The mandrels may be formed by means of techniques of photolithography and etching, wherein the etch process stops at the etch stop layer. Then, a layer of a sidewall spacer material that may be etched selectively relative to the material of the etch stop layer may be substantially isotropically deposited over the mandrels. Thereafter, the layer of sidewall spacer material may be anisotropically etched for removing portions of the layer of sidewall spacer material over substantially horizontal portions of the semiconductor structure. Due to the anisotropy of the etch process, portions of the layer of sidewall spacer material at the sidewalls of the mandrel may remain in the semiconductor structure.

Thereafter, the mandrels may be removed by means of an etch process, wherein the sidewall spacers remain in the semiconductor structure. Thereafter, a further etch process that is adapted to selectively remove the material of the etch stop layer relative to the material of the sidewall spacers may be performed. Thus, a mask having a pattern corresponding to the arrangement of the sidewall spacers may be formed from the etch stop layer. Then, the sidewall spacers may be removed, and the patterned etch stop layer may be employed as a mask for patterning materials below the etch stop layer.

Since the dimensions of the sidewall spacers formed adjacent the mandrels are not limited by the resolution of the photolithography process, sizes of features that are formed by patterning the material below the mask formed from the etch stop layer can be smaller than feature sizes obtainable by directly patterning a material by means of a photolithography process.

For obtaining even smaller feature sizes, a double sidewall image transfer (SIT2) process may be performed wherein the mask that is formed from a first etch stop layer in a first sidewall image transfer process is used for forming mandrels for a second sidewall image transfer process from a second mandrel layer. Adjacent these mandrels, sidewall spacers may be formed. After a removal of the mandrels formed from the second mandrel layer, the sidewall spacers may be used for forming a mask from a second etch stop layer that is provided below the second mandrel layer. The mask formed from the second etch stop layer may then be used for patterning a material below the second etch stop layer, for example, a semiconductor material from which fins of FinFET transistors and/or Tri-Gate transistors are to be formed.

In semiconductor manufacturing processes, so-called overlay/alignment marks may be employed. The overlay/alignment marks may be formed in a first patterning process wherein one or more materials of a semiconductor structure are patterned, and they may be used in one or more second patterning processes for aligning the semiconductor structure and a photomask.

However, using overlay/alignment marks in combination with sidewall image transfer techniques as described above may have some issues associated therewith, in particular when a double sidewall image transfer technique is employed.

When a photolithography process that is employed for forming mandrels is also employed for forming a feature that is provided for defining an overlay/alignment mark, a plurality of fins may be formed from this feature in the later steps of the sidewall image transfer process. However, dimensions of overlay/alignment marks may be substantially different from dimensions of circuit elements, such as FinFET transistors and/or Tri-Gate transistors. Typical examples of alignment/overlay marks may include arrangements of features having dimensions in a range from about 150 nm to about 1.5 μm, whereas a pitch between adjacent fins and width of fins for FinFET transistors and/or Tri-Gate transistors may be as small as about 7 nm. Accordingly, when features provided for defining overlay/alignment marks are patterned by means of sidewall image transfer techniques, arrangements including relatively long fins that are provided at relatively large distances may be created. Since patterning conditions of the sidewall image transfer processes are typically adapted for fin patterns that are employed for providing FinFET transistors and/or Tri-Gate transistors, the fins that are formed from the overlay/alignment mark features may be vulnerable to collapsing, which can create defects in the semiconductor structure and compromise the functionality of the overlay/alignment marks in later manufacturing processes.

For addressing this issue, it has been proposed to perform a so-called "zero level patterning," wherein overlay/alignment marks are formed in a semiconductor structure before any process steps that are performed for the formation of fins. However, in this case, the alignment/overlay marks typically include relatively deep trenches in the substrate, into which the layer stack that includes mandrel layers and etch stop layers for use in the sidewall image transfer techniques is filled, and the sidewall image transfer stack may have to be pulled out from the overlay/alignment marks by means of additional steps of the manufacturing process, which may increase the complexity of the manufacturing process.

As an alternative to the use of zero level patterning processes for the formation of alignment/overlay marks, it has been proposed to form a first set of overlay/alignment marks by means of a photolithography process that is performed for defining the mandrels of the first sidewall image transfer process of a double sidewall image transfer process and to form a second set of overlay/alignment marks by means of another photolithography process that is performed between the first and the second sidewall image transfer process of the double sidewall image transfer process. The other photolithography process can also be used for forming a large feature mask that is employed in the patterning of parts of the semiconductor structure from which transistors are formed. In later stages of the semiconductor manufacturing process, the second set of overlay/alignment marks can be used. However, in this case, the first set of overlay/alignment marks may still be a defect source in later stages of the manufacturing process due to collapsing fins, and later stages of the manufacturing process may be adversely affected by alignment errors in the formation of the second set of overlay/alignment marks.

Other techniques may include a pitch reduction in overlay/alignment marks which, however, may be insufficient for preventing a collapse of fins.

The present disclosure provides methods of manufacturing semiconductor structures that may help to overcome or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. The semiconductor structure includes a substrate. The substrate includes a material to be patterned. A first mandrel and a second mandrel are formed over the substrate. The formation of the first mandrel and the second mandrel includes a common photolithography process that defines a position of the first mandrel relative to the substrate and a position of the second mandrel relative to the substrate. A first sidewall spacer is formed adjacent the first mandrel and a second sidewall spacer is formed adjacent the second mandrel. After the formation of the first and the second sidewall spacers, the first mandrel is removed. The second mandrel remains in the semiconductor structure. A first mask element is provided on the basis of the first sidewall spacer. A second mask element is provided on the basis of the second mandrel and the second sidewall spacer. The material to be patterned is patterned on the basis of the first and the second mask elements.

Another illustrative method disclosed herein includes providing a semiconductor structure including a substrate. The substrate includes a material to be patterned. A layer stack is formed over the substrate. The layer stack includes a top mandrel layer and a bottom mandrel layer. A photomask is formed over the top mandrel layer by means of a photolithography process. The top mandrel layer is patterned using the photomask, wherein a first mandrel and a second mandrel are formed. A first sidewall spacer is formed adjacent the first mandrel and a second sidewall spacer is formed adjacent the second mandrel. After the formation of the first sidewall spacer and the second sidewall spacer, the first mandrel and the second mandrel are removed. A first mask element is formed on the basis of the first sidewall spacer and a second mask element is formed on the basis of the second sidewall spacer. The bottom mandrel layer is patterned on the basis of the first mask element and the second mask element, wherein a third mandrel is formed from a portion of the bottom mandrel layer below the first mask element and a fourth mandrel is formed from a portion of the bottom mandrel layer below the second mask element. A third sidewall spacer is formed adjacent the third mandrel and a fourth sidewall spacer is formed adjacent the fourth mandrel. After the formation of the third and the fourth sidewall spacers, the third mandrel is removed. The fourth mandrel remains in the semiconductor structure. A third mask element is formed on the basis of the third sidewall spacer. A fourth mask element is formed on the basis of the fourth mandrel and the fourth sidewall spacer. The material to be patterned is patterned on the basis of the third and the fourth mask elements, wherein a fin is formed from portions of the material to be patterned below the third mask element and an alignment/overlay mark is formed from portions of the material to be patterned below the fourth mask element.

BRIEF DESCRIPTION OF THE DRAWINGS

The disclosure may be understood by reference to the following description taken in conjunction with the accompanying drawings, in which like reference numerals identify like elements, and in which.

Figure 1:
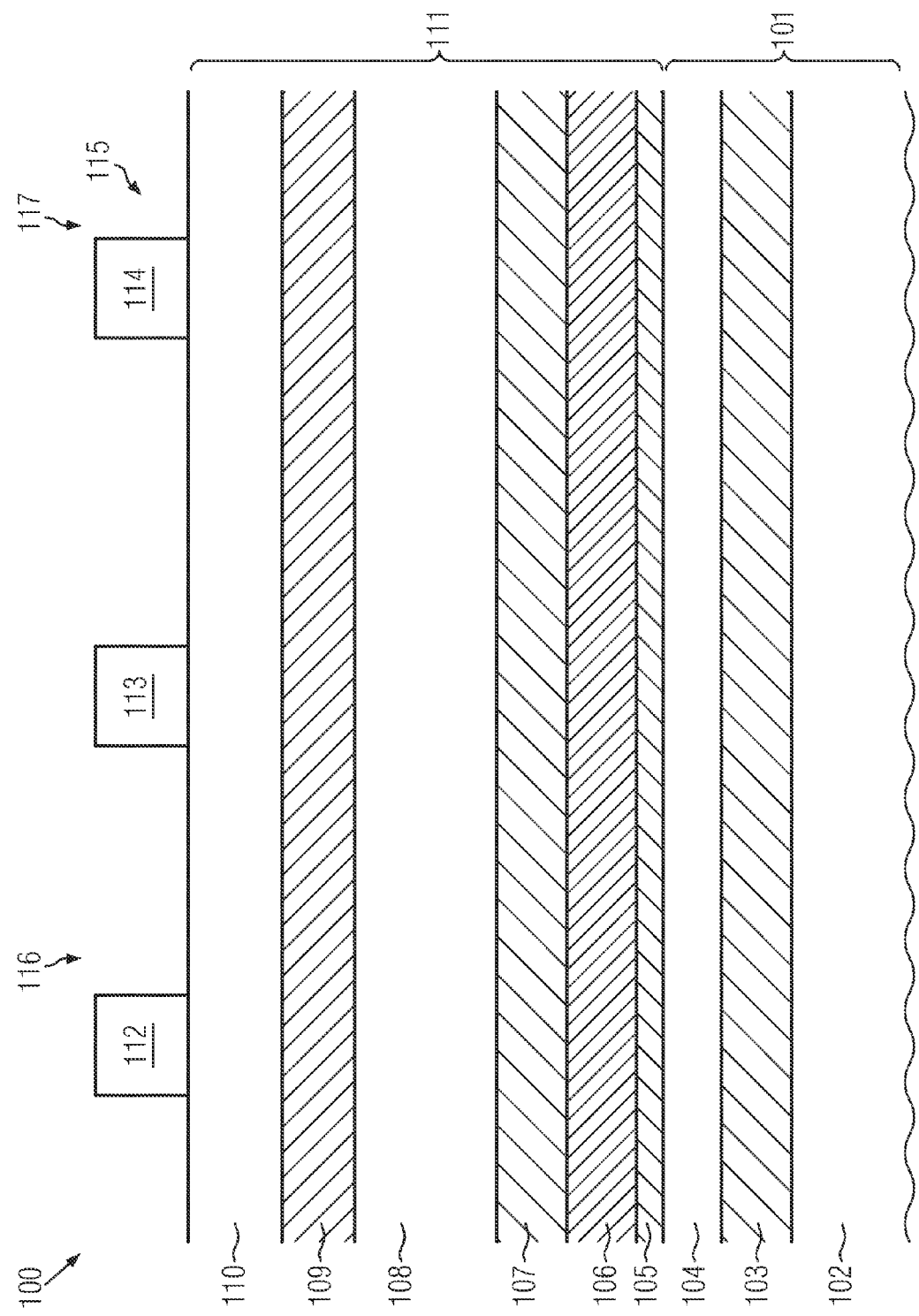
FIGS. 1-12 show schematic cross-sectional views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides embodiments wherein mandrels that are used for forming fins and mandrels that are used for forming overlay/alignment marks are defined by means of a common photolithography process in the first sidewall image transfer process of a double sidewall image transfer process. In the second sidewall image transfer process of the double sidewall image transfer process, mandrels of the overlay/alignment marks can be blocked by means of a block mask while mandrels in other areas of the semiconductor structure wherein fins are to be formed are removed. Thus, in the areas of the overlay/alignment marks, features having greater dimensions can be obtained than in areas of the semiconductor structure wherein fins are formed by means of the double sidewall image transfer process. This may help to avoid or at least reduce a collapsing of patterns in the areas of the overlay/alignment marks.

FIG. 1 shows a schematic cross-sectional view of a semiconductor structure 100 in a stage of a method according to an embodiment. The semiconductor structure 100 includes a substrate 101. The substrate 101 may be a semiconductor-on-insulator substrate that includes a layer 104 of a semiconductor material such as, for example, silicon that is provided on a layer 103 of an electrically insulating material such as, for example, silicon dioxide. The layer 103 of electrically insulating material may be formed over a support wafer 102 that may be a silicon wafer. The substrate 101 may be formed in accordance with known techniques for the formation of semiconductor-on-insulator (SOI) substrates. As will be detailed in the following, in the methods described herein, the layer 104 of semiconductor material will be patterned. Therefore, the layer 104 of semiconductor material provides a material to be patterned.

Over the substrate 101, a layer stack 111 for a double sidewall image transfer process may be provided. The layer stack 111 may include a top mandrel layer 110. The top mandrel layer 110 may include amorphous silicon. Below the top mandrel layer 110, a first etch stop layer 109 may be provided, which, in some embodiments, may include silicon nitride. Below the first etch stop layer 109, a bottom mandrel layer 108, which may include amorphous silicon, may be provided. Below the bottom mandrel layer 108, a second etch stop layer 107, which is provided over a third etch stop layer 106, may be provided. The second etch stop layer 107 may be formed of a different material than the first etch stop layer 109, wherein the material of the first etch stop layer 109 and the material of the second etch stop layer 107 may be etched selectively relative to each other. In embodiments wherein the first etch stop layer 109 includes silicon nitride, the second etch stop layer 107 may include silicon dioxide. The third etch stop layer 106 may be formed of a different material than the second etch stop layer 107, wherein the material of the third etch stop layer 106 is selected such that it may be etched selectively relative to the material of the second etch stop layer 107. The material of the third etch stop layer 106 may be substantially the same material as the material of the first etch stop layer 109. In embodiments wherein the first etch stop layer 109 includes silicon nitride and the second etch stop layer 107 includes silicon dioxide, the third etch stop layer 106 may also include silicon nitride. Between the third etch stop layer 106 and the layer 104 of the semiconductor material to be patterned, a pad layer 105 which, in some embodiments, may include silicon dioxide, may be provided.

The layers of the layer stack 111 may be formed by means of known techniques for the formation of material layers over a semiconductor substrate. In particular, the pad layer 105 may be deposited by means of chemical vapor deposition or plasma-enhanced chemical vapor deposition. Additionally, and/or alternatively, the formation of the pad layer 105 may include a thermal oxidation process wherein a material of the pad layer 105 is formed by means of an oxidation of the semiconductor material of the layer 104. In some embodiments, a part of the pad layer 105 may be formed by means of a thermal oxidation process, and the rest of the pad layer 105 may be formed by depositing the rest of the pad layer 105 thereon by means of a chemical vapor deposition process or a plasma-enhanced chemical vapor deposition process. In other embodiments, the entire pad layer 105 may be formed by means of a thermal oxidation process.

After the formation of the pad layer 105, the third etch stop layer 106, the second etch stop layer 107, the bottom mandrel layer 108, the first etch stop layer 109 and the top mandrel layer 110 may be deposited in this order, wherein processes of chemical vapor deposition or plasma-enhanced chemical vapor deposition of the materials of the respective layers may be employed.

Over the layer stack 111, a photomask 115 may be provided. The photomask 115 includes portions 112, 113, 114. The portions 112, 113 may be provided at a device area 116 of the semiconductor structure 100, and the portion 114 may be provided at an overlay/alignment mark area 117 of the semiconductor structure 100. As will be detailed in the following, the portions 112, 113 of the photomask 115 may be employed in the formation of a plurality of fins from the layer 104 of semiconductor material to be patterned in the device area 116 of the semiconductor structure 100, and the portion 114 of the photomask 115 may be employed in the formation of an alignment/overlay mark from the layer 104 of semiconductor material to be patterned in the overlay/alignment mark area 117 of the semiconductor structure 100. Thus, the photomask 115 is a common photomask for the formation of fins and for the formation of an overlay/alignment mark, wherein the position of the photomask 115 relative to the substrate 101 defines both positions of the fins and intermediate structures such as mandrels employed in the formation of the fins relative to the substrate 101, and a position of the overlay/alignment mark and intermediate structures such as mandrels employed in the formation of the alignment/overlay mark relative to the substrate 101.

Positions of the portions 112, 113, 114 of the photomask 115 relative to the substrate 101 need not be identical to the positions of the fins, the alignment/overlay mark and the intermediate structures relative to the substrate 101 defined by the photomask 115. Due to the nature of the processes employed for the formation of the fins and the overlay/alignment mark described in the following, the final positions of the fins and the alignment/overlay marks as well as the positions of the intermediate structures may be different from the positions of the portions 112, 113, 114 of the photomask 115 wherein, however, the positions of the fins, the overlay/alignment mark and the intermediate structures are in a predetermined spatial relationship relative to the positions of the portions 112, 113, 114 of the photomask 115.

The photomask 115 may be formed by means of a photolithography process. Since the photolithography process is used both for forming the portions 112, 113 of the photomask 115, which are employed in the formation of the fins, and the portion 114 of the photomask 115 which is employed in the formation of the overlay/alignment mark, the photolithography process employed for the formation of the photomask 115 will sometimes be denoted as a "common photolithography process" herein.

The present disclosure is not limited to embodiments wherein the photomask 115 is formed directly on the top mandrel layer 110. In other embodiments, a hardmask layer formed of a hardmask material such as silicon dioxide and/or silicon nitride may be formed over the top mandrel layer 110, and the photomask 115 may be formed over the layer of hardmask material. The photomask 115 may then be employed for forming a hardmask from the layer of hardmask material by means of an etch process. Thereafter, the photomask 115 may be removed, and the hardmask may be employed in further processing steps instead of the photomask 115. For simplicity, in the following, reference will be made to embodiments wherein the photomask 115 is formed over the top mandrel layer 110, and the photomask 115 itself is employed in the further processing steps.

Figure 2:
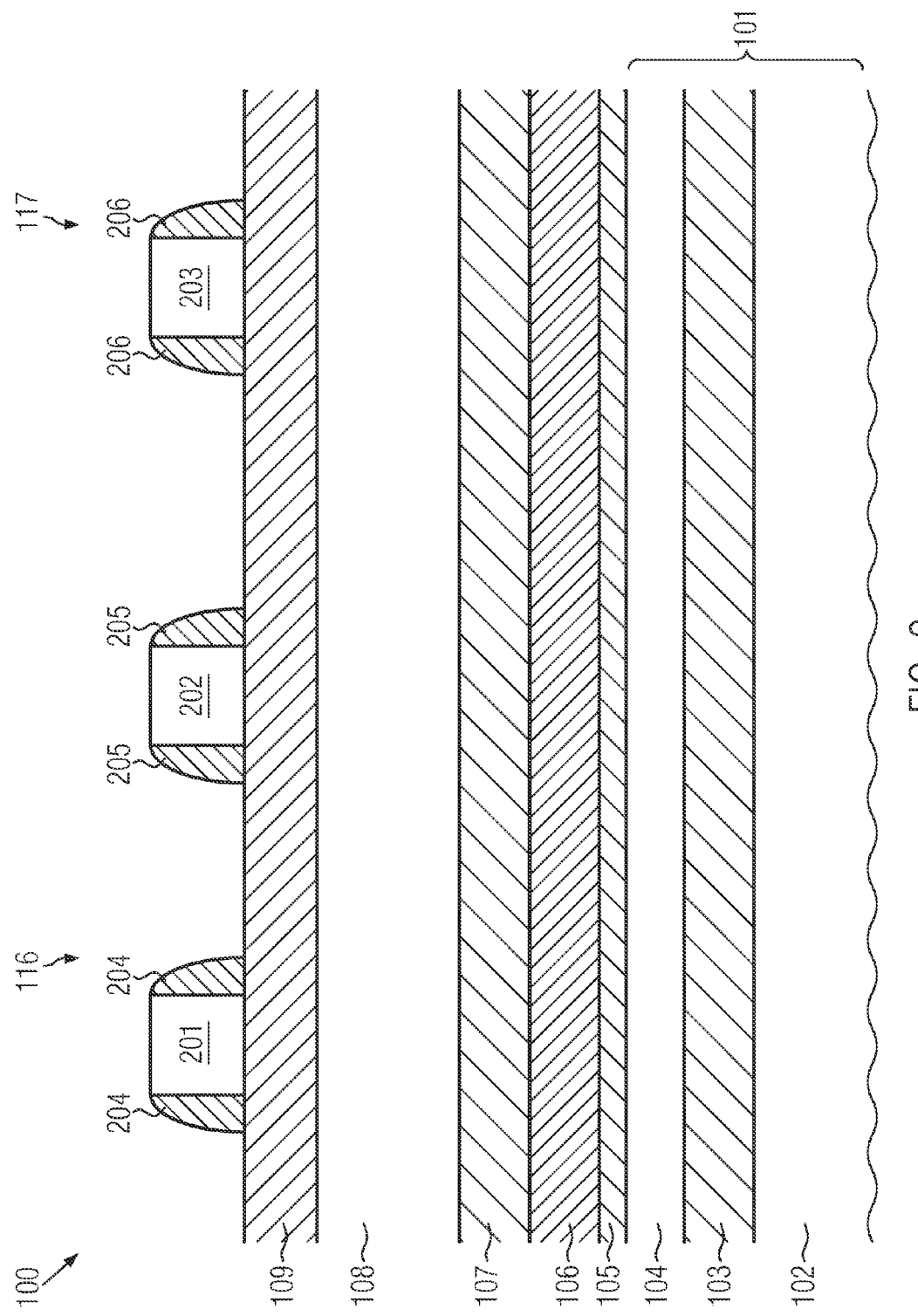

FIG. 2 shows a schematic cross-sectional view of the semiconductor structure 100 in a later stage of the manufacturing process. After the formation of the photomask 115, an etch process adapted to selectively remove the material of the top mandrel layer 110 relative to the material of the first etch stop layer 109 may be performed in the presence of the photomask 115. In the etch process, portions of the top mandrel layer 110 which are not covered by any of the portions 112, 113, 114 of the photomask 115 may be removed, whereas portions of the top mandrel layer 110 below the portions 112, 113, 114 of the photomask 115 remain in the semiconductor structure 100 and form mandrels 201, 202, 203. The mandrels 201, 202 are provided at positions relative to the substrate 101 corresponding to the positions of the portions 112, 113 of the photomask 115 and are provided in the device area 116 of the semiconductor structure 100. The mandrel 203 is provided at a position relative to the substrate 101 corresponding to the position of the portion 114 of the photomask 115 and is provided in the alignment/overlay mark area 117 of the semiconductor structure 100. After the formation of the mandrels 201, 202, 203, the photomask 115 may be removed by means of a resist strip process.

After the formation of the mandrels 201, 202, 203, a sidewall spacer 204 may be formed adjacent the mandrel 201, a sidewall spacer 205 may be formed adjacent the mandrel 202 and a sidewall spacer 206 may be formed adjacent the mandrel 203.

For forming the sidewall spacers 204, 205, 206, a layer of a sidewall spacer material such as, for example, silicon dioxide may be substantially isotropically deposited over the semiconductor structure 100, for example, by means of a chemical vapor deposition process or a plasma-enhanced chemical vapor deposition process. Thereafter, an anisotropic etch process, for example a dry etch process adapted to remove the sidewall spacer material, may be performed. The anisotropic etch process may be stopped when portions of the layer of the sidewall spacer material over top surfaces of the mandrels 201, 202, 203 and portions of the layer of sidewall spacer material over portions of the first etch stop layer 109 that are exposed between the mandrels 201, 202, 203 are removed. Due to the anisotropy of the etch process, portions of the layer of sidewall spacer material at the sidewalls of the mandrels 201, 202, 203 may remain in the semiconductor structure 100 and form the sidewall spacers 204, 205, 206.

Figure 3:
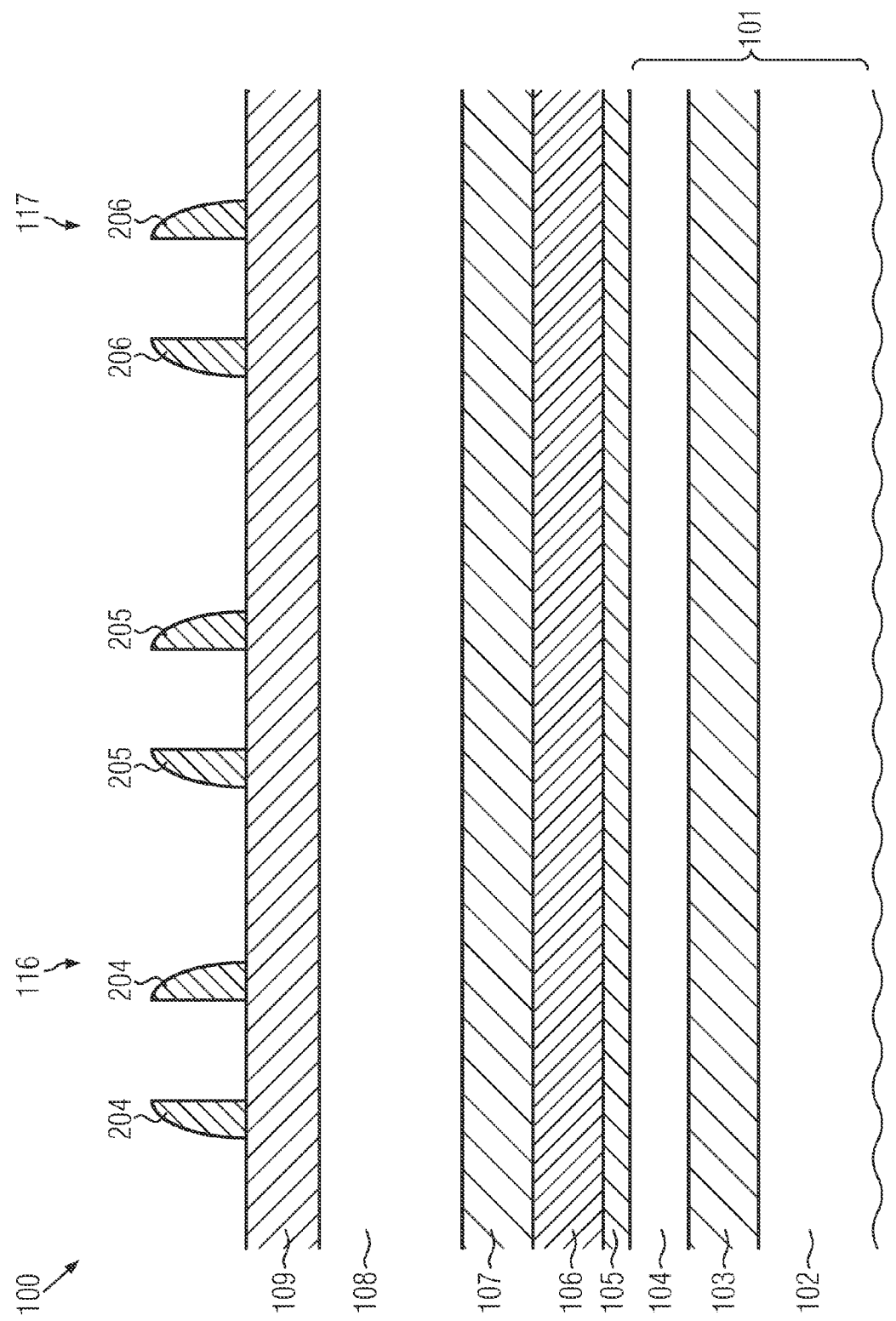

FIG. 3 shows a schematic cross-sectional view of the semiconductor structure 100 in a later stage of the manufacturing process. After the formation of the sidewall spacers 204, 205, 206, the mandrels 201, 202, 203 may be removed by means of an etch process adapted to selectively remove the material of the top mandrel layer 110 from which the mandrels 201, 202, 203 have been formed relative to the materials of the sidewall spacers 204, 205, 206 and the first etch stop layer 109. Thus, the sidewall spacers 204, 205, 206 remain in the semiconductor structure 100 after the removal of the mandrels 201, 202, 203.

An extension of each of the parts of the sidewall spacers 204, 205, 206 that were formed on opposite sides of the mandrels 201, 202, 203 in a horizontal direction of the semiconductor structure 100 (horizontal in the view of FIG. 3) that is perpendicular to a thickness direction of the substrate 101 (vertical in the view of FIG. 3) may be smaller than an extension of the mandrels 201, 202, 203 in the horizontal direction. Since the dimensions of the sidewall spacers 204, 205, 206 depend on features of the process employed for the deposition of the layer of sidewall spacer material and the etch process employed for etching the layer of sidewall spacer material, but not on a resolution of the photolithography process employed for forming the photomask 115, the extension of the parts of the sidewall spacers 204, 205, 206 in the horizontal direction may be smaller than a resolution limit of the photolithography process.

Figure 4:
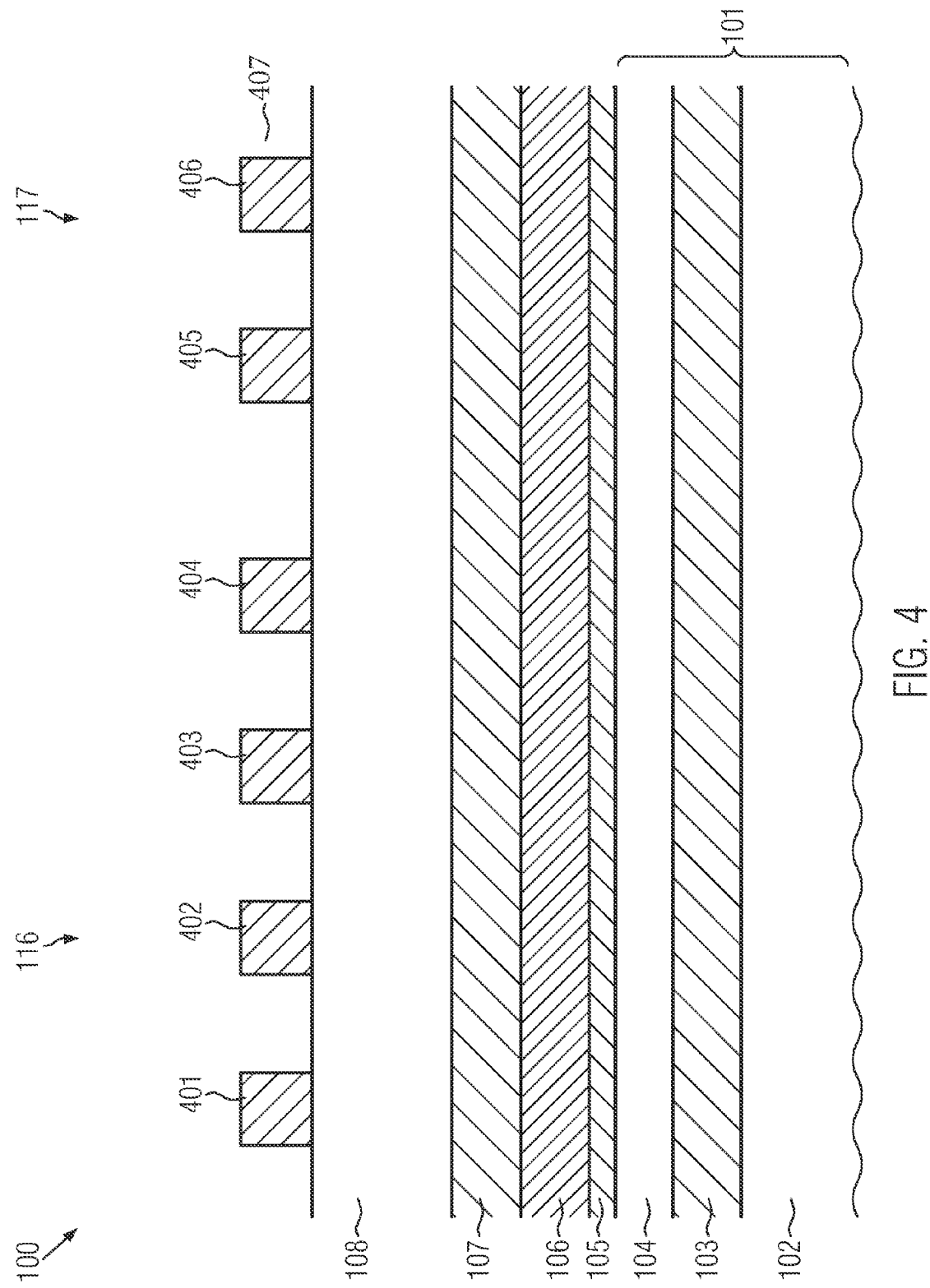

FIG. 4 shows a schematic cross-sectional view of the semiconductor structure 100 in a later stage of the manufacturing process. After the removal of the mandrels 201, 202, 203, an etch process, for example, a dry etch process adapted to selectively remove the material of the etch stop layer 109 relative to the material of the sidewall spacers 204, 205, 206, may be performed. In the etch process, portions of the etch stop layer 109 which are not covered by any of the sidewall spacers 204, 205, 206 may be removed. Portions of the etch stop layer 109 below the sidewall spacers 204, 205, 206 may remain in the semiconductor structure 100 and form a mask 407.

The mask 407 includes mask elements 401, 402 which are formed from portions of the etch stop layer 109 below the sidewall spacer 204, mask elements 403, 404 which are formed from portions of the etch stop layer 109 below the sidewall spacer 205 and mask elements 405, 406 which are formed from portions of the etch stop layer 109 below the sidewall spacer 206. Thus, two mask elements may be formed on the basis of each of the sidewall spacers 204, 205, 206 (one for each of the parts of the sidewall spacers that were formed on opposite sides of the mandrels 201, 202, 203) so that the number of mask elements of the mask 407 may be twice the number of the mandrels 201, 202, 203 and twice the number of the portions 112, 113, 114 of the photomask 115.

After the formation of the mask 407, an etch process adapted to selectively remove the material of the sidewall spacers 204, 205, 206 relative to the material of the etch stop layer 109 from which the mask elements 401, 402, 403, 404, 405, 406 are formed and relative to the material of the top mandrel layer 108 may be performed. In the etch process, the sidewall spacers 204, 205, 206 may be removed, wherein the mask 407 remains in the semiconductor structure 100. In embodiments wherein the sidewall spacers 204, 205, 206 are formed of silicon dioxide, the etch stop layer 109 includes silicon nitride and the top mandrel layer 108 includes amorphous silicon, the etch process for removing the sidewall spacers 204, 205, 206 may be a wet etch process wherein buffered hydrogen fluoride is used as an etchant.

Figure 5:
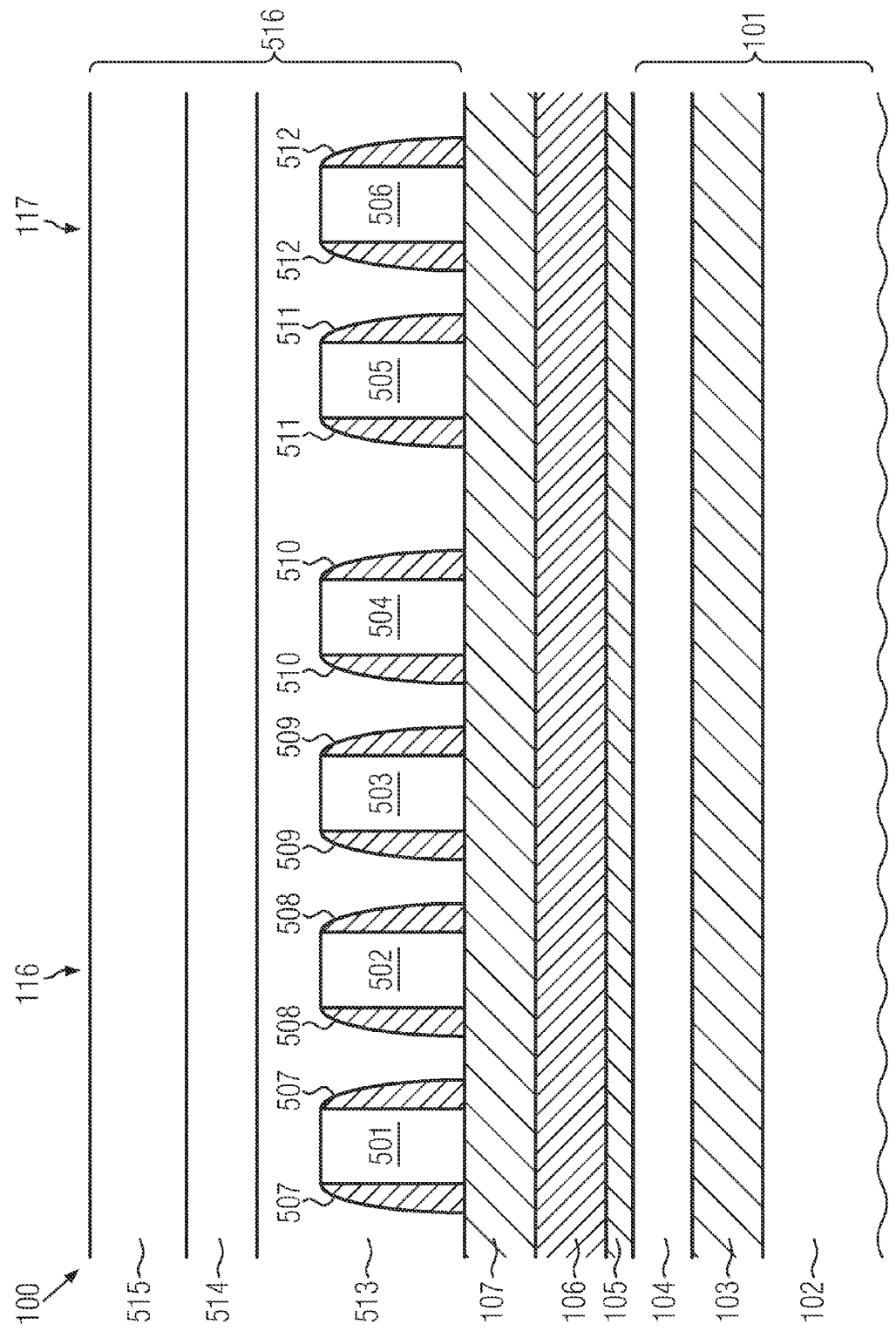

FIG. 5 shows a schematic cross-sectional view of the semiconductor structure 100 in a later stage of the manufacturing process. After the formation of the mask 407 and the removal of the sidewall spacers 204, 205, 206, the bottom mandrel layer 108 may be patterned on the basis of the mask elements 401, 402, 403, 404, 405, 406 of the mask 407. For this purpose, an etch process adapted to selectively remove the material of the bottom mandrel layer 108 relative to the materials of the mask 407 and the etch stop layer 107 may be performed. In some embodiments, the etch process may be a dry etch process, for example, a reactive ion etch process.

In the etch process, portions of the bottom mandrel layer 108 which are not covered by any of the mask elements 401 to 406 may be removed. Portions of the bottom mandrel layer 108 below the mask elements 401 to 406 may remain in the semiconductor structure 100 and form mandrels 501 to 506. In particular, portions of the bottom mandrel layer 108 in the device area 116 of the semiconductor structure 100 below the mask elements 401 to 404 can form mandrels 501, 502, 503, 504 in the device area 116. Portions of the bottom mandrel layer 108 below the mask elements 405, 406 in the overlay/alignment mark area 117 may form mandrels 505, 506.

Portions of the mandrels 501, 502 relative to the substrate 101 correspond to positions of the mask elements 401, 402 which, as detailed above, have been formed on the basis of the sidewall spacer 204 that was formed adjacent the mandrel 201. The mandrel 201, in turn, was formed from portions of the top mandrel layer 110 below the portion 112 of the photomask 115. Thus, the position of the mandrels 501, 502 relative to the substrate 101 are defined by the position of the portion 112 of the photomask 115 relative to the substrate 101. Similarly, positions of the mandrels 503, 504 relative to the substrate 101 are defined by the position of the portion 113 of the photomask 115 relative to the substrate 101, and positions of the mandrels 505, 506 relative to the substrate 101 are defined by the position of the portion 114 of the photomask 115 relative to the substrate 101. Accordingly, the positions of each of the mandrels 501 to 506, which include mandrels 501 to 504 in the device area 116 and mandrels 505, 506 in the overlay/alignment mask area 117, are defined by the photomask 115 that was formed in the common photolithography process.

After the formation of the mandrels 501 to 506, the mask 407 may be removed. For this purpose, an etch process adapted for selectively removing the material of the etch stop layer 109 from which the mask 407 was formed relative to the materials of the bottom mandrel layer 108 from which the mandrels 501 to 506 were formed and the etch stop layer 107 below the bottom mandrel layer 108 may be performed.

Thereafter, sidewall spacers 507 to 512 may be formed adjacent the mandrels 501 to 506. For this purpose, a layer of a sidewall spacer material may be substantially isotropically deposited over the semiconductor structure 100. The sidewall spacer material may be adapted such that the sidewall spacer material may be etched selectively relative to the material of the etch stop layer 107. In embodiments wherein the etch stop layer 107 includes silicon dioxide, the sidewall spacer material may include silicon nitride. For depositing the layer of sidewall spacer material, deposition techniques such as chemical vapor deposition or plasma-enhanced chemical vapor deposition may be employed.

Thereafter, an anisotropic etch process adapted to selectively remove the sidewall spacer material may be performed. In some embodiments, the etch process may be a dry etch process. The anisotropic etch process may be stopped as soon as horizontal portions of the layer of sidewall spacer material are removed, the sidewall spacers 507 to 512 remaining in the semiconductor structure 100.

After the formation of the sidewall spacers 507 to 512, a tri-layer coating 516 may be formed over the semiconductor structure 100. The tri-layer coating 516 may include an organic planarization layer 513 that is provided over the mandrels 501 to 506, the sidewall spacers 507 to 512 and the etch stop layer 107, an anti-reflective coating 514 that is provided over the organic planarization layer 513 and a photoresist layer 515 that is provided over the anti-reflective coating 514.

The organic planarization layer 513 may include an organic polymer material such as polymethylmethacrylate and/or polymethylisopropenylketone, and it may be formed by means of spin coating. A surface of the organic planarization layer 513 may have a substantially smaller topography than the surface provided by the mandrels 501 to 506, the sidewall spacers 507 to 512 and the etch stop layer 107. The anti-reflective coating 514 may be a silicon-containing anti-reflective coating including a silicon-containing polymer, and it may be formed by means of a spin coating process. The photoresist layer 515 may include a conventional photoresist.

Figure 6:
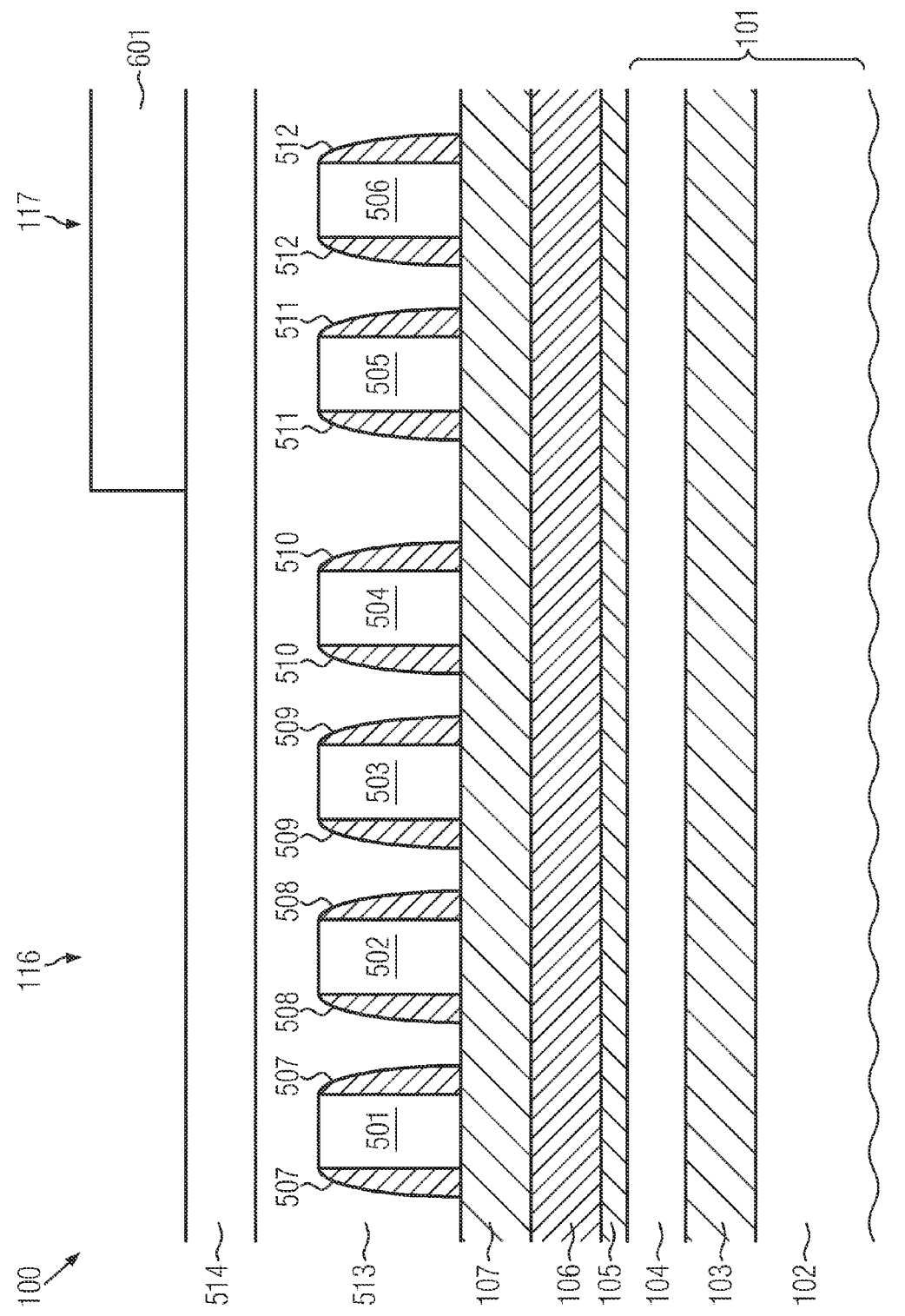

FIG. 6 shows a schematic cross-sectional view of the semiconductor structure 100 in a later stage of the manufacturing process. After the formation of the tri-layer coating 516, the photoresist layer 515 may be patterned by means of a block mask photolithography process, wherein a photoresist mask 601 is formed. An extension of the photoresist mask 601 may correspond to an extension of a block mask that will be described in more detail below. The photoresist mask 601 may be provided over the overlay/alignment mark area 117, whereas the device area 116 is not covered by the photomask 601. The photomask 601 covers portions of the organic planarization layer 513 and the anti-reflective coating 514 over the mandrels 505, 506 in the alignment/overlay mark area 117. Portions of the organic planarization layer 513 and the anti-reflective coating 514 over the mandrels 501 to 504 in the device area 116 are not covered by the photoresist mask 601.

Figure 7:
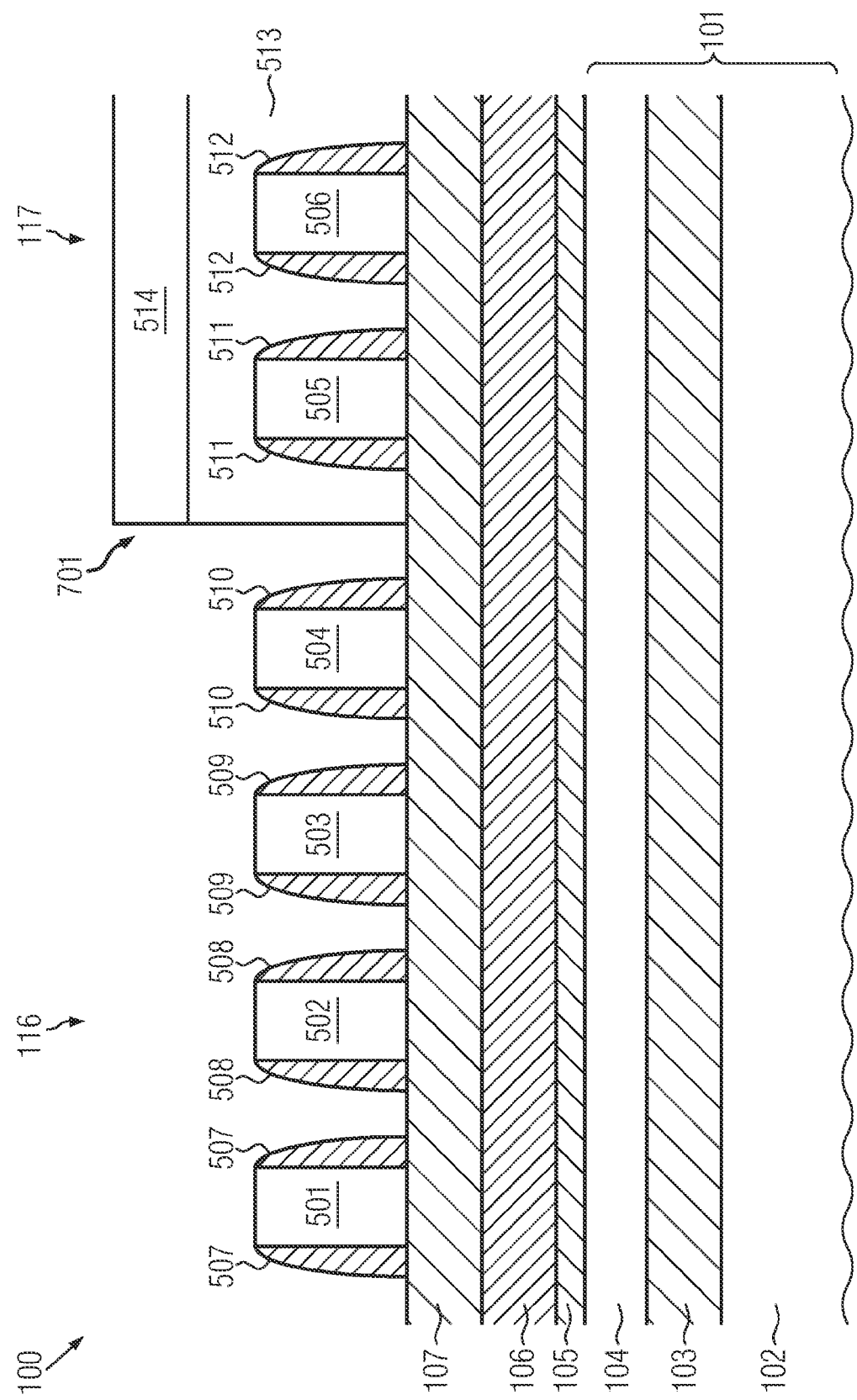

FIG. 7 shows a schematic cross-sectional view of the semiconductor structure 100 in a later stage of the manufacturing process. After the formation of the photomask 601, an etch process adapted for removing portions of the anti-reflective coating 514 and the organic planarization layer 513 which are not covered by the photoresist mask 601 may be performed. In some embodiments, this etch process may include a reactive ion etch process. Thereafter, the photoresist mask 601 may be removed by means of a resist strip process. Portions of the organic planarization layer 513 and the anti-reflective coating 514 that were covered by the photoresist mask 601 during the etch process form a block mask 701. The block mask 701 covers the mandrels 505, 506 and the sidewall spacers 511, 512 in the overlay/alignment mark area 117. The mandrels 501 to 504 and the sidewall spacers 507 to 510 in the device area 116 are not covered by the block mask 701 and are exposed at the surface of the semiconductor structure 100.

Figure 8:
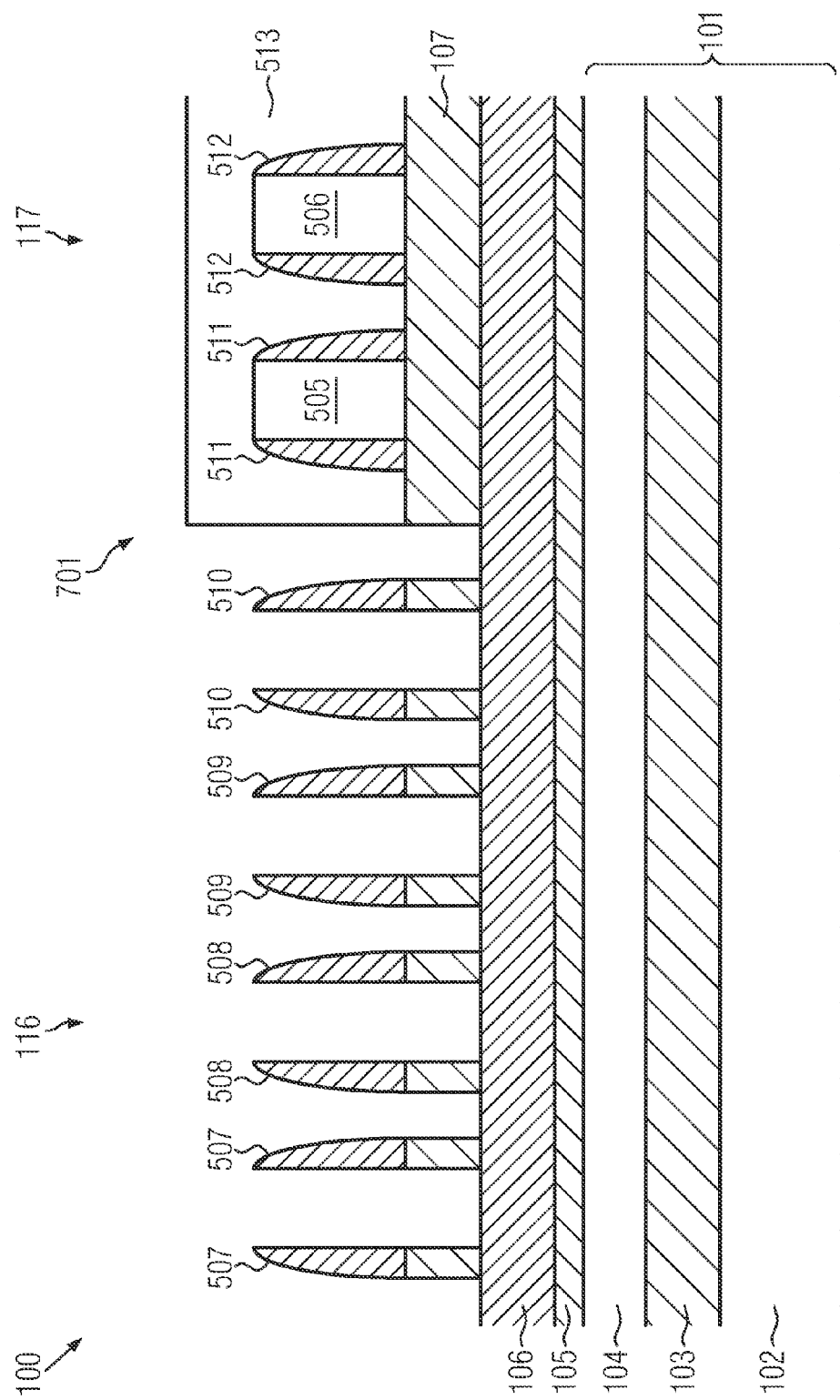

FIG. 8 shows a schematic cross-sectional view of the semiconductor structure 100 in a later stage of the manufacturing process. After the formation of the block mask 701, an etch process adapted to selectively remove the material of the bottom mandrel layer 108 from which the mandrels 501 to 506 were formed relative to the materials of the sidewall spacers 507 to 512 and the etch stop layer 107 may be performed. In some embodiments, the etch process may be a dry etch process. In embodiments wherein the bottom mandrel layer 108 includes amorphous silicon, the sidewall spacers 507 to 512 include silicon nitride, and the etch stop layer 107 includes silicon dioxide, the etch process may be adapted for selectively removing silicon relative to silicon nitride and silicon dioxide.

In the etch process, the mandrels 501 to 504 may be removed from the semiconductor structure 100. The mandrels 505, 506 at the overlay/alignment mark area 117 are protected from an etchant used in the etch process by the block mask 701 and remain in the semiconductor structure 100. Furthermore, due to the selectivity of the etch process, the sidewall spacers 507 to 512 may remain in the semiconductor structure 100.

In embodiments wherein the anti-reflective coating 514 is a silicon-containing anti-reflective coating, the etch process performed for removing the mandrels 501 to 504 may also remove the portion of the anti-reflective coating 514 over the overlay/alignment mark area 117. However, the portion of the organic planarization layer 513 at the overlay/alignment mark area 117 may remain substantially unaffected by the etch process and can act as block mask 701 even in the absence of the anti-reflective coating 514.

After the removal of the mandrels 501 to 504 from the device area 116 of the semiconductor structure 100, an etch process adapted to selectively remove the material of the etch stop layer 107 relative to the materials of the sidewall spacers 507 to 512 and the etch stop layer 106 may be performed in the presence of the block mask 701. In embodiments wherein the sidewall spacers 507 to 512 and the etch stop layer 106 include silicon nitride and the etch stop layer 107 includes silicon dioxide, the etch process may be a reactive ion etch process adapted for the selective removal of silicon dioxide relative to silicon nitride.

In the etch process, portions of the etch stop layer 107 which are neither covered by the block mask 701 nor by any of the sidewall spacers 507 to 510 at the device area 116 may be removed from the semiconductor structure 100. Portions of the etch stop layer 107 below the sidewall spacers 507 to 510 and portions of the etch stop layer 107 below the block mask 701 may be protected from an etchant used in the etch process so that they are not removed in the etch process.

Figure 9:
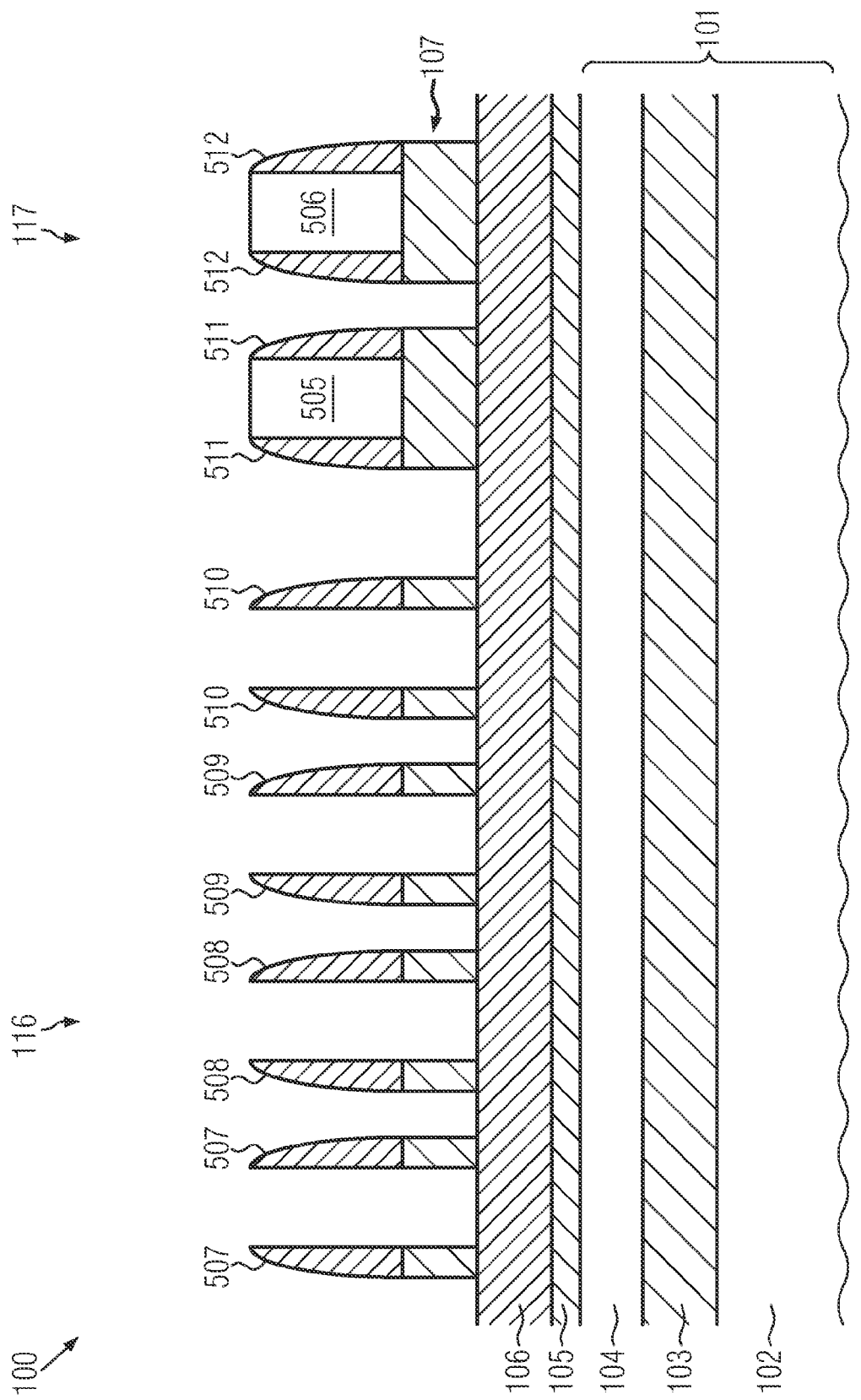

FIG. 9 shows a schematic cross-sectional view of the semiconductor structure 100 in a later stage of the manufacturing process. The block mask 701 may be removed so that the mandrels 505, 506 at the overlay/alignment mark area 117, the sidewall spacers 511, 512 and the parts of the etch stop layer 107 at the overlay/alignment mark area 117 that are not covered by the mandrels 505, 506 or the sidewall spacers 511, 512 are exposed at the surface of the semiconductor structure 100.

Thereafter, an etch process adapted for selectively removing the material of the etch stop layer 107 relative to the materials of the sidewall spacers 507 to 512, the mandrels 505, 506 and the etch stop layer 106 may be performed. In embodiments wherein the etch stop layer 107 includes silicon dioxide, the etch process may be a reactive ion etch process adapted for selectively removing silicon dioxide. In the etch process, portions of the etch stop layer 107 that are covered by neither the mandrels 505, 506 nor by any of the sidewall spacers 507, 512 may be removed. Portions of the etch stop layer 107 covered by the mandrels 505, 506 or the sidewall spacers 507 to 512 may remain in the semiconductor structure 100.

Providing two etch processes for removing the material of the etch stop layer 107, wherein one of the etch processes is performed in the presence of the block mask 701 and the other etch process is performed after the removal of the block mask 701 may allow an adaptation of parameters of the etch process that is performed before the removal of the block mask 701 to the requirements of the removal of portions of the etch stop layer 107 at the device area 116 and an adaptation of the parameters of the etch process that is performed after the removal of the block mask 701 to the requirements of the removal of portions of the etch stop layer 107 at the overlay/alignment mark area 117. Since an extension of the sidewall spacers 507 to 510 at the device area 116 in at least one horizontal direction of the semiconductor structure 100 (horizontal in the view of FIG. 9) may be substantially smaller than the extension of the combinations of the mandrels 505, 506 and the sidewall spacers 511, 512 in the horizontal direction, the removal of portions of the etch stop layer 107 at the device area 116 and the removal of portions of the etch stop layer 107 at the overlay/alignment mark area 117 may be subject to different requirements.

Figure 10:
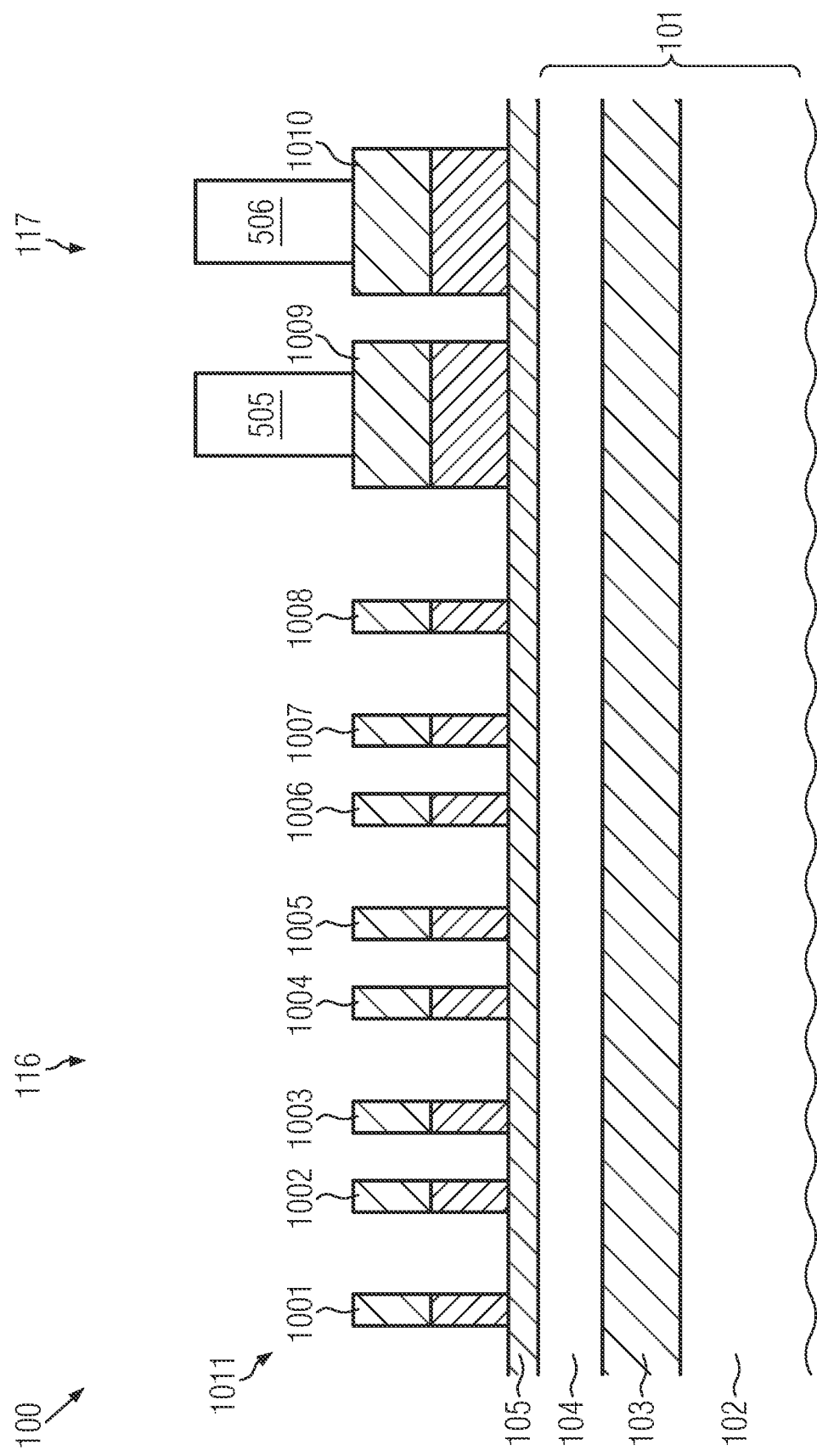

FIG. 10 shows a schematic cross-sectional view of the semiconductor structure 100 in a later stage of the manufacturing process. After the removal of portions of the etch stop layer 107 which are covered by neither the mandrels 505, 506 nor any of the sidewall spacers 507 to 512, an etch process adapted to selectively remove the material of the etch stop layer 106 relative to the material of the etch stop layer 107 may be performed. In embodiments wherein the etch stop layer 106 includes silicon nitride and the etch stop layer 107 includes silicon dioxide, the etch process may be a reactive ion etch process adapted for the selective removal of silicon nitride relative to silicon dioxide. In embodiments wherein the sidewall spacers 507 to 512 are formed from the same material as the etch stop layer 106, the etch process may also remove the sidewall spacers 507 to 512. The mandrels 505, 506 at the overlay/alignment mark region 117 need not be removed in the etch process.

In the etch process, a mask 1011 is formed. The mask 1011 includes mask elements 1001 to 1008 that are provided at the device area 116 and mask elements 1009, 1010 which are provided at the overlay/alignment mark area 117.

The mask elements 1001 to 1008 at the device area 116 are provided on the basis of portions of the etch stop layers 106, 107 below the sidewall spacers 507 to 510. Since the mandrels 501 to 504 at the device area 116 were removed from the semiconductor structure 100 before the etching of the materials of each of the etch stop layers 106, 107, the mask elements 1001 to 1008 have an extension in a horizontal direction perpendicular to the thickness direction of the substrate 101 (horizontal in the view of FIG. 10) that corresponds to an extension of the sidewall spacers 507 to 510 in the horizontal direction. Thus, the extensions of the mask elements 1001 to 1008 in the horizontal direction may be smaller than the extensions of the mandrels 501 to 504 in the horizontal direction. Furthermore, since each of the sidewall spacers 507 to 510 includes portions that were provided on both sides of one of the mandrels 501 to 504 adjacent of which the respective sidewall spacer was provided, the number of the mask elements 1001 to 1008 may be twice the number of the mandrels 501 to 504.

The mask element 1009 at the overlay/alignment mark area 117 is provided on the basis of the combination of the mandrel 505 and the sidewall spacer 511 provided adjacent thereof. Accordingly, the extension of the mask element 1009 in the horizontal direction may correspond to a sum of the extension of the mandrel 505 in the horizontal direction and twice the extension of the sidewall spacer 511 in the horizontal direction. Thus, the extension of the mask element 1009 in the horizontal direction may be greater than the extension of each of the mask elements 1001 to 1008 in the horizontal direction.

Similarly, the extension of the mask element 1010 in the horizontal direction may correspond to a sum of the extension of the mandrel 506 in the horizontal direction and twice the extension of the sidewall spacer 512 in the horizontal direction. Accordingly, the extension of the mask element 1010 in the horizontal direction may be approximately equal to the extension of the mask element 1009 in the horizontal direction and greater than the extension of each of the mask elements 1001 to 1008 in the horizontal direction.

Furthermore, for each of the mandrels 505, 506, a single mask element may be formed in the overlay/alignment mark area 117 whereas, as detailed above, for each of the mandrels 501 to 504 at the device area 116, two mask elements are formed.

Thus, embodiments disclosed herein allow providing different dimensions of mask elements 1009, 1010 in the overlay/alignment area 117 and mask elements 1001 to 1008 in the device area 116 even if, in the formation of each of the mask elements 1001 to 1010, mandrels 501 to 506 are employed, the dimensions of which are defined by the dimensions of the sidewall spacers 204 to 206, which have been formed from the same layer of sidewall spacer material and, accordingly, have approximately the same dimensions.

Figure 11:
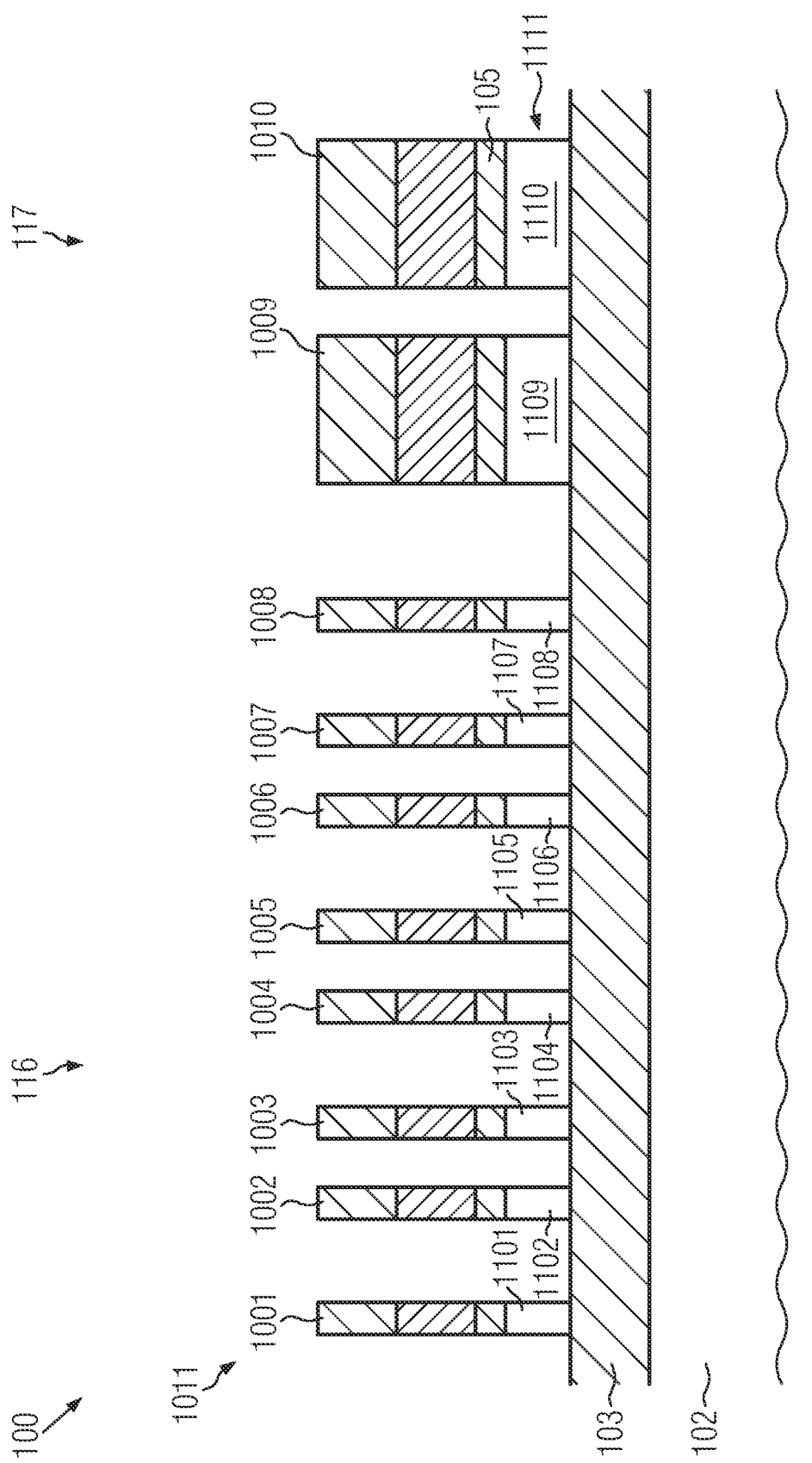

FIG. 11 shows a schematic cross-sectional view of the semiconductor structure 100 in a later stage of the manufacturing process. After the formation of the mask 1011, an etch process adapted to remove the semiconductor material of the layer 104 of semiconductor material to be patterned may be performed. In embodiments wherein the layer 104 of semiconductor material includes silicon, the etch process may be a reactive ion etch process that is adapted for etching silicon. In the etch process, portions of the layer 104 of semiconductor material to be patterned that are not covered by any of the mask elements 1001 to 1010 may be removed from the semiconductor structure 100. Thus, the layer 104 is patterned on the basis of the mask elements 1001 to 1010.

Portions of the layer 104 in the device area 116 of the semiconductor structure 100 may be patterned on the basis of the mask elements 1001 to 1008, which may have a relatively small extension in the horizontal direction. In doing so, fins 1101 to 1108 are formed from portions of the layer 104 below the mask elements 1001 to 1008.

In the overlay/alignment mark area 117 of the semiconductor structure 100, portions of the layer 104 of semiconductor material to be patterned below the mask elements 1009, 1010 are protected from an etchant used in the etch process adapted for removing the semiconductor material of the layer 104 and remain in the semiconductor structure 100. Thus, in the overlay/alignment mark area 117, the layer 104 is patterned on the basis of the mask elements 1009, 1010. Thus, portions 1109, 1110 of an overlay/alignment mark 1111 may be formed in the overlay/alignment mark area 117. Since, as detailed above, extensions of the mask elements 1009, 1010 in the overlay/alignment mark area 117 may be greater than extensions of the mask elements 1001 to 1008 in the device area 116, the extensions of the portions 1109, 1110 of the overlay/alignment mark 1111 in the horizontal direction may be substantially greater than the extensions of the fins 1101 to 1108 in the horizontal direction.

This may help to substantially avoid or at least reduce a collapse of the portions 1109, 1110 of the overlay/alignment mark 1111. Furthermore, due to the relatively large dimensions of the portions 1109, 1110 of the overlay/alignment mark 1111, the functionality of the overlay/alignment mark 1111 for aligning photoresist masks in later stages of the manufacturing process may be improved.

Figure 12:
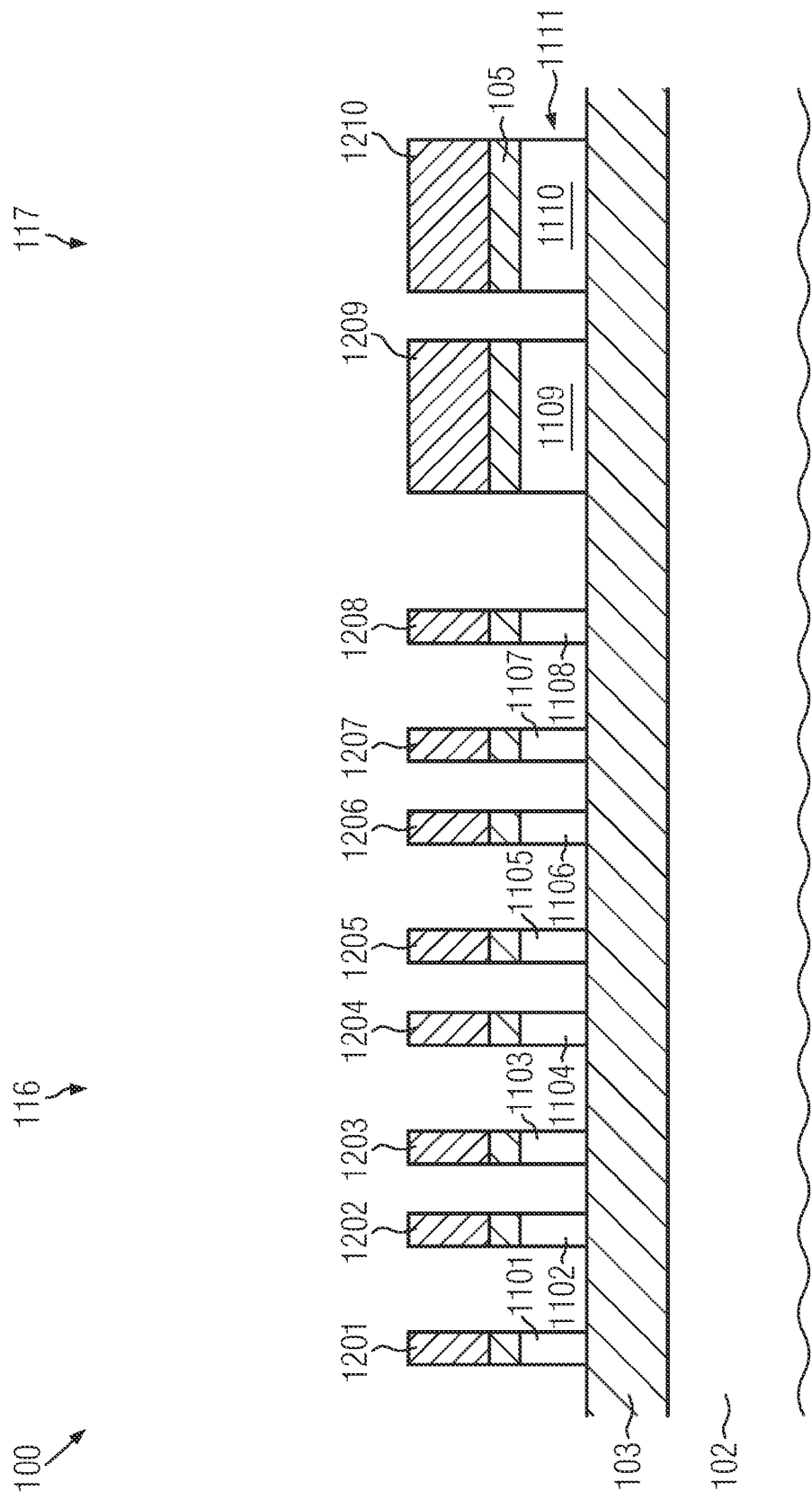

FIG. 12 shows a schematic cross-sectional view of the semiconductor structure 100 in a later stage of the manufacturing process. After the etching of the layer 104 of semiconductor material, portions 1201 to 1210 of the mask 1011 that were formed from the etch stop layer 107 may be removed. In embodiments wherein the etch stop layer 107 includes silicon dioxide, this may be done by means of a wet etch process wherein buffered hydrogen fluoride is used as an etchant. Then, known processing steps may be performed for forming one or more FinFET or Tri-Gate transistors in the device area 116 that include the fins 1101 to 1108. In some embodiments, portions of the mask 1011 that were formed from the etch stop layer 106 may be used as a stop layer for a chemical mechanical polishing process performed at a later stage of the manufacturing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:

providing a semiconductor structure comprising a substrate comprising a material to be patterned;

forming a first mandrel and a second mandrel over said substrate, the formation of said first mandrel and said second mandrel comprising a common photolithography process defining a position of said first mandrel relative to said substrate and a position of said second mandrel relative to said substrate;

forming a first sidewall spacer adjacent said first mandrel and a second sidewall spacer adjacent said second mandrel;

after the formation of said first and the second sidewall spacers, forming a block mask over said semiconductor structure, wherein said second mandrel is covered by said block mask and said first mandrel is not covered by said block mask and wherein forming said block mask comprises:

forming an organic planarization layer over said semiconductor structure;

forming an anti-reflective coating over said organic planarization layer;

forming a photoresist layer over said anti-reflective coating; and patterning said photoresist layer by means of a block mask photolithography process, wherein a photoresist mask is formed, portions of said organic planarization layer and said anti-reflective coating over said second mandrel being covered by said photoresist mask, portions of said organic planarization layer and said anti-reflective coating over said first mandrel not being covered by said photoresist mask, with said block mask in position, removing said first mandrel, while leaving said second mandrel remaining in maid semiconductor structure; and providing a first mask element on the basis of said first sidewall spacer and a second mask element on the basis of said second mandrel and said second sidewall spacer and patterning said material to be patterned on the basis of said first and said second mask element, wherein a fin is formed front portions of said material to be patterned below said first mask element and an alignment/overlay mark is formed from portions of said material to be patterned below said second mask element.

2. The method of claim 1, wherein the formation of said block mask further comprises:

performing a first etch process adapted to remove materials of said organic planarization layer and said anti-reflective coating in the presence of said photoresist mask; and removing said photoresist mask.

3. The method of claim 2, further comprising:

forming a layer stack over said semiconductor substrate, said layer stack comprising a top mandrel layer and a bottom mandrel layer;

forming a common photomask over said top mandrel layer by means of said common photolithography process;

patterning said top mandrel layer using said common photomask, wherein a third mandrel and a fourth mandrel are formed;

forming a third sidewall spacer adjacent said third mandrel and a fourth sidewall spacer adjacent said fourth mandrel; and after the formation of said third sidewall spacer and said fourth sidewall spacer, removing said third mandrel and said fourth mandrel, forming a third mask element on the basis of said third sidewall spacer, forming a fourth mask element on the basis of said fourth sidewall spacer and patterning said bottom mandrel layer on the basis of said third mask element and said fourth mask element, wherein said first mandrel is formed from a portion of said bottom mandrel layer below said third mask element and said second mandrel is formed from a portion of said bottom mandrel layer below said fourth mask element.

4. The method of claim 3, wherein said layer stack further comprises a first etch stop layer between said top mandrel layer and said bottom mandrel layer and wherein the formation of said third mask element and said fourth mask element comprises:

performing a second etch process adapted to selectively remove a material of said first etch stop layer relative to a material of said third sidewall spacer and said fourth sidewall spacer, wherein portions of said first etch stop layer below said third sidewall spacer remain in said semiconductor structure and form said third mask element and portions of said first etch stop layer below said fourth sidewall spacer remain in said semiconductor structure and form said fourth mask element; and after performing said second etch process, removing said third sidewall spacer from said third mask element and removing said fourth sidewall spacer from said fourth mask element.

5. The method of claim 4, further comprising, after the formation of said first and said second mandrel, removing said third mask element and said fourth mask element.

6. The method of claim 5, wherein said layer stack further comprises a second etch stop layer below said bottom mandrel layer and a third etch stop layer below said second etch stop layer, wherein said second etch stop layer and said third etch stop layer comprise different materials that are selectively etchable relative to each other.

7. The method of claim 6, wherein providing said first and said second mask element comprises:

performing a third etch process adapted to remove a material of said second etch stop layer in the presence of a portion of said organic planarization layer over said second mandrel;

removing said portion of said organic planarization layer over said second mandrel; and after the removal of said portion of said organic planarization layer over said second mandrel, performing a fourth etch process adapted to remove the material of said second etch stop layer.

8. The method of claim 7, wherein providing said first and said second mask element further comprises, after said fourth etch process, performing a fifth etch process adapted to remove the material of said third etch stop layer.

9. The method of claim 8, wherein said material to be patterned comprises a semiconductor material.

10. The method of claim 9, wherein said semiconductor material comprises silicon.

11. The method of claim 10, wherein said top mandrel layer and said bottom mandrel layer comprise amorphous silicon.

12. The method of claim 11, wherein said first etch stop layer and said third etch stop layer comprise silicon nitride.

13. The method of claim 12, wherein said second etch stop layer comprises silicon dioxide.

14. The method of claim 13, wherein said third sidewall spacer and said fourth sidewall spacer comprise silicon dioxide.

15. The method of claim 14, wherein said first sidewall spacer and said second sidewall spacer comprise silicon nitride.

16. The method of claim 15, wherein said layer stack further comprises a silicon dioxide pad layer below said third etch stop layer.

17. A method, comprising:

providing a semiconductor structure comprising a substrate comprising a material to be patterned;

forming a layer stack over said substrate, said layer stack comprising a top mandrel layer and a bottom mandrel layer;

forming a photomask over said top mandrel layer by means of a photolithography process;

patterning said top mandrel layer using said photomask, wherein a first mandrel and a second mandrel are formed;

forming a first sidewall spacer adjacent said first mandrel and a second sidewall spacer adjacent said second mandrel;

after the formation of said first sidewall spacer and said second sidewall spacer, removing said first mandrel and said second mandrel, forming a first mask element on the basis of said first sidewall spacer, forming a second mask element on the basis of said second sidewall spacer and patterning said bottom mandrel layer on the basis of said first mask element and said second mask element, wherein a third mandrel is formed from a portion of said bottom mandrel layer below said first mask element and a fourth mandrel is formed from a portion of said bottom mandrel layer below said second mask element;

forming a third sidewall spacer adjacent said third mandrel and a fourth sidewall spacer adjacent said fourth mandrel;

after the formation of said third and said fourth sidewall spacer, removing said third mandrel, said fourth mandrel remaining in said semiconductor structure; and forming a third mask element on the basis of said third sidewall spacer, forming a fourth mask element on the basis of said fourth mandrel and said fourth sidewall spacer and patterning said material to be patterned on the basis of said third and said fourth mask elements, wherein a fin is formed from portions of said material to be patterned below said third mask element and an alignment/overlay mark is formed from portions of said material to be patterned below said fourth mask element.

18. A method, comprising:

providing a semiconductor structure comprising a substrate comprising a material to be patterned;

forming a first mandrel and a second mandrel over said substrate, said first and second mandrels having lateral dimensions that are the same, the formation of said first mandrel and said second mandrel comprising a common photolithography process defining a position of said first mandrel relative to said substrate and a position of said second mandrel relative to said substrate;

forming a first sidewall spacer adjacent said first mandrel and a second sidewall spacer adjacent said second mandrel;

after the formation of said first and the second sidewall spacers, removing said first mandrel, said second mandrel remaining in said semiconductor structure; and providing a first mask element on the basis of said first sidewall spacer and a second mask element on the basis of said second mandrel and said second sidewall spacer and patterning said material to be patterned on the basis of said first and said second mask elements, wherein a fin is formed from portions of said material to be patterned below said first mask element and an alignment/overlay mark is formed from portions of said material to be patterned below said second mask element.

* * * * *

UNITED STATES PATENT AND TRADEMARK OFFICE
CERTIFICATE OF CORRECTION

PATENT NO.        : 9,379,017 B1
APPLICATION NO.   : 14/687203
DATED             : June 28, 2016
INVENTOR(S)       : Min Gyu Sung et al.

Page 1 of 1

It is certified that error appears in the above-identified patent and that said Letters Patent is hereby corrected as shown below:

In the claims,

Col. 15, line 3, delete – "maid" – and insert therefor – --"said"-- –.

Col. 15, line 7, delete – "pattering" – and insert therefor – --"patterning"-- –.

Col. 15, line 8, delete – "element" – and insert therefor – --"elements"-- –.

Col. 15, line 9, delete – "front" – and insert therefor – --"from"-- –.

Signed and Sealed this
Twenty-third Day of August, 2016

Michelle K. Lee
*Director of the United States Patent and Trademark Office*